United States Patent
Fujisawa et al.

(10) Patent No.: US 6,809,946 B2
(45) Date of Patent: Oct. 26, 2004

(54) SEMICONDUCTOR MEMORY DEVICE AND METHOD OF CONTROLLING THE SAME

(75) Inventors: Hiroki Fujisawa, Tokyo (JP); Hideyuki Yokou, Tokyo (JP)

(73) Assignees: Elpida Memory, Inc., Tokyo (JP); Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/443,645

(22) Filed: May 22, 2003

(65) Prior Publication Data

US 2004/0004890 A1 Jan. 8, 2004

(30) Foreign Application Priority Data

May 23, 2002 (JP) ........................................ 2002/149310

(51) Int. Cl.[7] ................................................ G11C 5/02
(52) U.S. Cl. .................................... 365/51; 365/230.03
(58) Field of Search ......................... 365/51, 63, 205, 365/207, 208, 230.03

(56) References Cited

U.S. PATENT DOCUMENTS 5,777,927 A * 7/1998 Takahashi et al. ...... 365/189.01
6,198,679 B1 * 3/2001 Nakasu et al. ............... 365/203
6,404,695 B1 * 6/2002 Fujino et al. ........... 365/230.03
6,665,203 B2 * 12/2003 Fujisawa et al. .............. 365/51

FOREIGN PATENT DOCUMENTS

JP          11-214652       8/1999     ......... H01L/27/108

* cited by examiner

Primary Examiner—Son Mai
(74) Attorney, Agent, or Firm—Choate, Hall & Stewart

(57) ABSTRACT

In a semiconductor memory device including a bank equipped having a predetermined memory capacity, a sub amplifier block is disposed at a center of the bank divided into two sections. The sub amplifier block includes a plurality of sub amplifiers connected to sense amplifier sets disposed in the two memory regions through an LIO and a sub amplifier control circuit for controlling the sub amplifiers. If the sub amplifier control circuit selects a word line, a control operation is performed to activate only one side of the sub amplifiers positioned on both sides of the word line to thereby reduce the power consumed for activating the sub amplifiers.

18 Claims, 9 Drawing Sheets

DQ ALLOTMENT IN X8 MODE

DQ ALLOTMENT IN X4 MODE

TOP LEFT PORTION
OF BANK 0

SEMICONDUCTOR MEMORY DEVICE AND METHOD OF CONTROLLING THE SAME

This application claims priority to prior application JP 2002-149310, the disclosure of which is incorporated herein by reference.

BACKGROUND OF THE INVENTION

The present invention relates to a semiconductor memory device and a control method for the same and, more particularly, to a dynamic RAM (hereinafter, will be referred to as the "DRAM") capable of reading/writing at high speed and a control method for the same.

Conventionally, this type of semiconductor memory device has a layered I/O structure. In a memory LSI using such a layered I/O structure, local I/O lines connected to sense amplifiers are connected to main amplifiers via main I/O lines. Furthermore, main amplifiers are connected to output circuits via global I/O lines, and these output circuits are connected to I/O terminals. Thus, as a semiconductor device having a layered I/O structure, a semiconductor memory device having sub amplifier circuits provided between the sense amplifier and the main amplifier in order to amplify micro-signals of the sense amplifier has been proposed (refer to, for example, Japanese Unexamined Patent Publication No. 11-214652 (hereinafter referred to as citation 1)). Citation 1 proposes the provision of a sub amplifier block in an area wherein a sense amplifier region and a sub word driver region intersect with each other, and discloses that the sub amplifier circuits are selectively activated.

As a semiconductor memory device having the configuration described above, a 512M DDR (Double Data Rate) memory device has been proposed. In this memory device, for example, four banks are disposed on a chip, and each bank is further divided into a plurality of memory mats. In this case, each bank has a 128M-bit memory capacity and is divided into memory mats, each having a 256K-bit memory capacity.

In the case of the proposed semiconductor memory device, a column decoder is disposed at the center of each bank, and the column decoder activates a column selector line to thereby read data from a sense amplifier to an I/O line.

Meanwhile, in this type of a large-capacity semiconductor memory device, the eight column selector lines of each bank are simultaneously activated. In this event, a selection may be made between a mode for reading the data from each bank into eight I/O terminals DQ0 through DQ7 (hereinafter referred to as the "x8 mode") and a mode for outputting the data from each bank to four of the I/O terminals DQ0 through DQ7 (hereinafter referred to as "x4 mode").

According to citation 1 described above, regardless of whether the x8 mode or the x4 mode is selected, the sense amplifiers corresponding to the eight column selector lines are selected, and the sub amplifier circuits in the crossing areas associated with the sense amplifiers are activated. The outputs of the activated sub amplifier circuits are supplied to a main amplifier through a main I/O line, and 8-bit data or 4-bit data is selected in the main amplifier or the output circuit.

With such a structure, the unnecessary data in the x4 mode is undesirably output up to the main amplifier or the output circuit through the main I/O line, resulting in more current drain in the x4 mode. Furthermore, citation 1 does not refer at all to shifting the control of the sub amplifier circuit between the x8 mode and the x4 mode, and provides no considerations to disposing the sub amplifier circuits in a concentrated manner.

SUMMARY OF THE INVENTION

It is therefore an object of the present invention to provide a semiconductor memory device which permits a reduction in the current drain in the x4 mode, as compared with a conventional semiconductor memory device.

It is another object of the present invention to provide a semiconductor memory device which permits a reduction in a layout area by improving the layout in a sub amplifier circuit.

It is a further object of the present invention to provide a control method for a semiconductor memory device that permits a reduction in the current drain when the sub amplifier circuits are simultaneously activated.

According to one aspect of the present invention, there is provided a semiconductor memory device having a bank that can be divided into a memory array including a plurality of memory mats, including a sense amplifier set connected to each memory array, sub amplifier circuit units connected to the sense amplifier set, and a main amplifier circuit unit connected to the sub amplifier circuits, wherein the sub amplifier circuit is disposed in a concentrated fashion in a central region wherein the bank is divided into first and second partial regions, the sub amplifier circuit comprises first and second groups of sub amplifiers respectively connected to a plurality of sense amplifier sets in the first and second partial regions, and a sub amplifier control circuit for controlling the first and second groups of sub amplifiers, and the sub amplifier control circuit is configured to commonly control the first and second groups of sub amplifiers.

Preferably, the semiconductor memory device in accordance with the present invention is further provided with a plurality of column selector lines extending in parallel to the central region on the memory mats, wherein these plural column selector lines, when simultaneously activated, connect a plurality of memory arrays in the first and second partial regions with the sub amplifiers of the first and second groups through the intermediary of the sense amplifier sets so that the sub amplifiers of the first and second groups are commonly controlled by the sub amplifier control circuit.

Preferably, the sub amplifier control circuit carries out control for selectively enabling or disabling the sub amplifiers of the first and second groups connected to the sense amplifier sets.

Preferably, the semiconductor memory device according to the present invention further includes a starter signal generator circuit that supplies a signal at a predetermined bit position of a column selection address signal to the sense amplifier control circuit as a starter signal for starting up the sub amplifier control circuit.

Preferably, when the column selector lines are simultaneously activated, two sense amplifier sets each are activated in the first and second partial regions, respectively, thereby connecting four sub amplifiers of the first group to the activated two sense amplifier sets with respect to the first partial region. Similarly, four sub amplifiers of the second group are connected to the two activated sense amplifier sets with respect to the second partial region, and the sub amplifier control circuit controls a total of eight sub amplifiers of the first and second groups to connect the sense amplifier sets in the first and second partial regions to a main amplifier through the intermediary of the eight sub amplifiers.

Preferably, the sub amplifier control circuit discriminates between write/read of data to/from the memory mats, and carries out control to bypass an amplifying section of each sub amplifier in a write mode, while it carries out control to enable the amplifying section of each sub amplifier in a read mode.

According to another aspect of the present invention, there is provided a semiconductor memory device having a bank that can be divided into memory arrays including a plurality of memory mats. The semiconductor memory device is provided with sense amplifier sets disposed on both sides of the memory arrays, sandwiching the memory arrays, first and second sub amplifier circuit units connected to the sense amplifier sets disposed on both sides of the memory arrays, and a main amplifier circuit unit connected to the first and second sub amplifier circuit units through via main input/output lines (MIO), wherein the first and second sub amplifier circuit units are disposed in a concentrated fashion in a central region in which the bank is divided into first and second partial regions, the first and second sub amplifier circuit units comprise a plurality of sub amplifiers disposed in the plurality of sense amplifier sets respectively disposed on both sides of the memory arrays and a sub amplifier control circuit for controlling the plurality of sub amplifiers on both sides of the memory arrays, and the sub amplifier control circuits in the first and second sub amplifier circuit units are configured to independently control a plurality of sub amplifiers in the first and second sub amplifier circuit units.

Preferably, the semiconductor memory device in accordance with the present invention further includes a sub amplifier starter signal generating circuit for supplying sub amplifier starter signals, which are different from each other, to the sub amplifier control circuits of the first and second sub amplifier circuit units.

Preferably, the semiconductor memory device in accordance with the present invention further includes a plurality of column selector lines extending in parallel to the central region on the memory arrays, and a word line extending through the memory arrays in the direction in which it crosses the column selector lines. If the word line is selected and the plurality of column selector lines are simultaneously activated, then the plurality of sense amplifier sets positioned on both sides of the memory arrays are selected and connected to the plurality of sub amplifiers provided in the first and second sub amplifier circuit units.

Preferably, each sub amplifier control circuit of the first and second sub amplifier circuits units carries out control to selectively enable or disable the plurality of sub amplifiers connected to the plurality of sense amplifier sets provided on both sides of the memory array.

Preferably, each sub amplifier control circuit of the first and second sub amplifier circuit units is capable of specifying a first mode for simultaneously enabling the plurality of sub amplifiers in the first and second sub amplifier circuit units positioned on both sides of the memory arrays or a second mode for selectively enabling only a plurality of sub amplifiers positioned on one side of the memory arrays.

Preferably, the semiconductor memory device according to the present invention further includes sub amplifier starter signal generating circuits for generating sub amplifier starter signals that supply predetermined bits of mutually complementary column selection address signals as sub amplifier starter signals to the sub amplifier control circuits of the first and second sub amplifier circuit units.

Preferably, each of the first and second sub amplifier circuits is provided with a single sub amplifier control circuit, and only the plurality of sub amplifiers of either the first or the second sub amplifier circuit unit is enabled in response to the sub amplifier starter signal in the second mode, while the plurality of sub amplifiers of both the first and second sub amplifier circuit units is enabled in the first mode, thus permitting a reduction in current drain in the sub amplifiers in the second mode.

Preferably, each of the first and second sub amplifier circuit units is provided with two sub amplifier control circuits that respectively operate in response to mutually complementary sub amplifier starter signals, and selectively enable the plurality of sub amplifiers in the first and second sub amplifier circuit units, respectively, disabling the remaining sub amplifiers in the second mode.

Preferably, in the bank, four column selector lines are simultaneously activated, eight sense amplifier sets positioned on both sides of four memory arrays are activated when the word line is selected, and each of the first and second sub amplifier circuit units has eight sub amplifiers.

Preferably, eight sub amplifiers in either the first or the second sub amplifier circuit unit are enabled by the control of the sub amplifier control circuit in the second mode.

According to yet another aspect of the present invention, there is provided a semiconductor memory device having a bank that can be divided into memory arrays including a plurality of memory mats, the semiconductor memory device including sense amplifier sets disposed on both sides of memory arrays, sandwiching the memory arrays, first and second sub amplifier circuit units connected to the sense amplifier sets disposed on both sides of the memory arrays, and a main amplifier circuit unit connected to the first and second sub amplifier circuit units through the intermediary of main input/output lines (MIO), wherein the first and second sub amplifier circuit units are disposed in a concentrated fashion in a central region wherein the bank is divided into first and second partial regions, the first and second sub amplifier circuit units comprise a plurality of sub amplifiers disposed in the plurality of sense amplifier sets respectively disposed on both sides of the memory arrays and a sub amplifier control circuit for controlling the plurality of sub amplifiers on both sides of the memory arrays, the sub amplifier control circuits in the first and second sub amplifier circuit units are configured to independently control a plurality of sub amplifiers in the first and second sub amplifier circuit units, and the wiring between the bit lines in the memory arrays and the sense amplifier sets disposed on both sides of the memory arrays is different from the wiring between the bit lines of other memory arrays and sense blocks disposed on both sides of other memory arrays.

According to a further aspect of the present invention, there is provided a control method for a semiconductor memory device comprising a bank that can be divided into memory arrays including a plurality of memory mats, and first and second sub amplifier circuit units connected to the sense amplifier sets disposed on both sides of the memory arrays, including a mode for enabling all sub amplifiers of the first and second sub amplifier circuit units, and a mode for selectively enabling the sub amplifiers of the first and second sub amplifier circuit units and for disabling the remaining sub amplifiers. The first and the second modes are selectively designated so as to permit a reduction in current drain.

BRIEF DESCRIPTION OF THE DRAWINGS

FIG. 6A and FIG. 6B illustrate a semiconductor memory device in accordance with an embodiment of the present invention, wherein FIG. 6A shows the position of a target memory region, and FIG. 6B is a block diagram specifically illustrating the configuration of the memory region;

DESCRIPTION OF THE PREFERRED EMBODIMENTS

Figure 1:
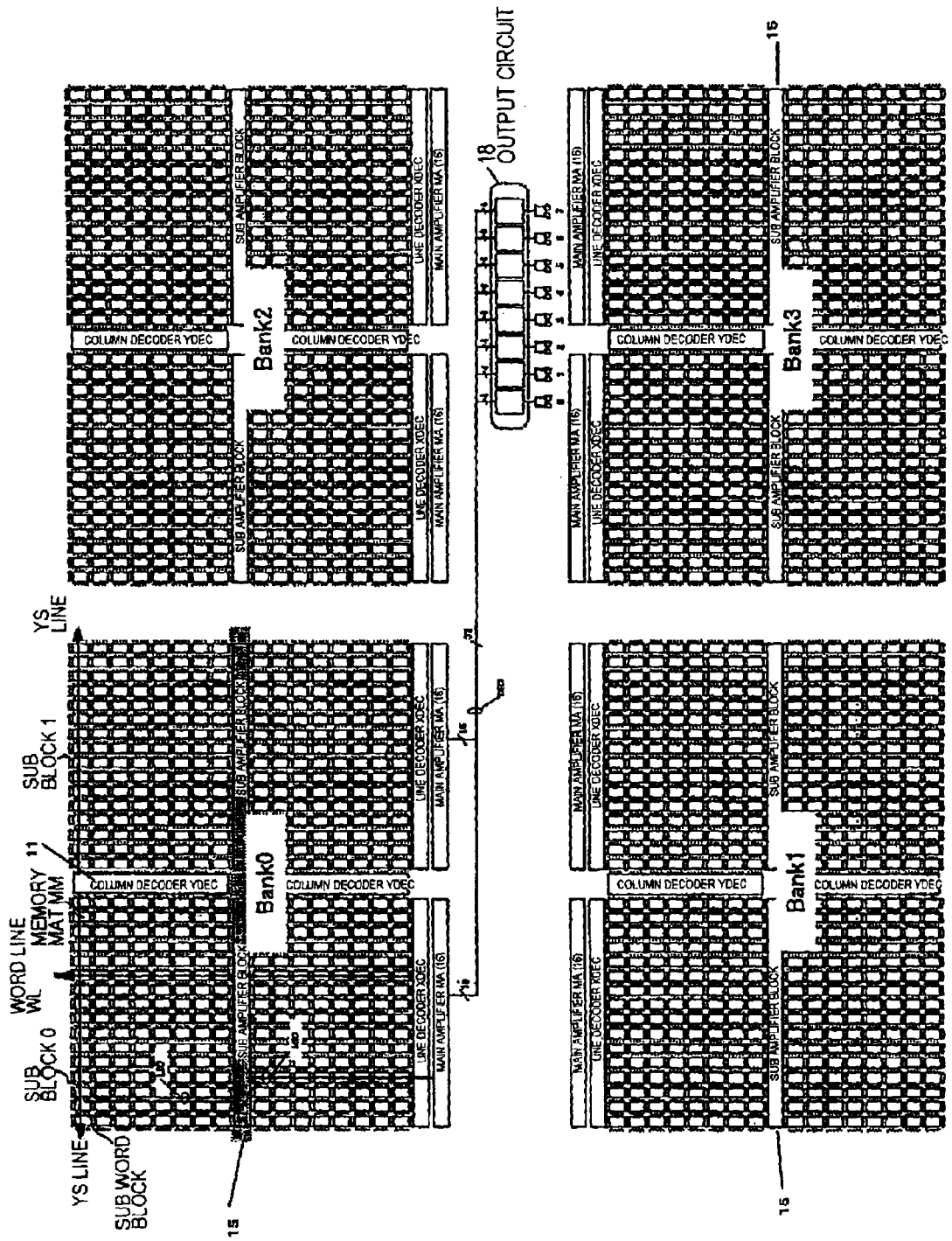
FIG. 1 is a layout diagram showing a schematic configuration of an entire semiconductor memory device in accordance with the present invention.

Referring to FIG. 1, description will be made of a semiconductor memory device according to an embodiment of the present invention. The semiconductor memory device according to the present invention has a layered I/O lines. The example shown in the figure is a case where the present invention has been applied to a 512M DDR semiconductor memory device, and the memory chip is divided into four banks (Banks 0, 1, 2 and 3) each having a 128M-bit memory capacity. Furthermore, each bank is divided into two sub blocks 0 and 1 in the lateral direction in the figure, and each of the sub blocks 0 and 1 is divided into 256 memory mats MM. As a result, a total of 512 memory mats MM is included in each of the banks 0, 1, 2 and 3. Thus, each memory mat MM shown in the figure is capable of storing 256K-bit data.

A column decoder (YDEC) 11 is provided at the center sandwiched between the sub blocks 0 and 1 of each of the banks 0, 1, 2 and 3. The column decoder (YDEC) 11 selects a column selector line YS, and a sense amplifier set connected to a pair of bit lines associated with the selected column selector line YS is selected, as it will be discussed hereinafter.

The banks 0, 1, 2 and 3 have main amplifiers MA located at the vertical center side of the memory chip, and line decoders (XDEC) are provided between the main amplifiers MA and the sub blocks 0, 1. A word line WL extends from the line decoder (XDEC) in the vertical direction in the figure. In this example, each of the sub blocks 0 and 1 is provided with 16 main amplifiers MA.

In the illustrated example, sub amplifier blocks 15 are provided at the vertical centers of the sub blocks 0, 1 of each of the banks 0, 1, 2 and 3. In the sub amplifier blocks 15, sub amplifier circuits connected to sense amplifiers and local I/O lines LIO in the sub blocks 0, 1 are disposed in a concentrated manner. Thus, the sub amplifier blocks 15 disposed at the center in a concentrated manner divide the banks 0, 1, 2 and 3 into first and second partial regions positioned at upper and lower sides in the figure. For the convenience of explanation, the four memory mats MM will be collectively referred to as a memory array MAY, and a group of sense amplifiers associated with the memory arrays will be referred to as a sense amplifier set.

For example, the eight memory mats MM arranged in the vertical direction or the direction of the word line WL are divided into two groups to constitute the memory arrays MAY in the first and second partial regions in the sub block 0 shown in FIG. 1. For each memory array MAY, the sense amplifier sets are disposed, one each on either side of each memory array. Each sense amplifier set includes a total of four groups of sense amplifiers, and each group of sense amplifiers is constructed of 256 sense amplifiers for each memory mat MM.

Moreover, the sub amplifier circuits are connected to the main amplifiers MA via main I/O lines MIO, and the main amplifiers MA are connected to an output circuit 18 via 32 global I/O lines GIO. The output circuit 18 shown in the figure has eight buffer circuits for storing 4-bit data and is connected to eight I/O terminals, namely, pins DQ0 through DQ7. Each of the I/O pins DQ0 through DQ7 is configured on a 4-bit basis. Thus, the semiconductor memory device shown in the figure is characterized by the layered I/O line structure from the local I/O line LIO up to the global I/O line GIO, and the sub amplifier circuits or the sub amplifier circuit regions 15 provided in a concentrated manner at the central portion in each of the banks 0, 1, 2 and 3. The sub amplifier circuits are intermediate amplifiers positioned between the sense amplifiers and the main amplifiers. The provision of the sub amplifier circuits allow the signals from the sense amplifiers to be amplified and output to the main amplifiers MA, thereby permitting quicker processing. FIG. 1 shows only the connection between the output circuit 18 and the bank 0 to simplify the explanation; the same applies to the connection between other banks and the output circuit 18.

In the semiconductor memory device shown in FIG. 1, four column selector lines YS in each of the sub blocks 0 and 1 of each of the banks 0, 1, 2 and 3 are simultaneously activated so as to read or write data, and written/read data is input/output through eight I/O pins DQ0 through DQ7 connected to the output circuit 18. The semiconductor memory device is adapted to select between a mode for simultaneously writing/reading data through the I/O pins DQ0 through DQ7 (hereinafter referred to as the "x8 mode") and a mode for simultaneously writing/reading data through DQ0 through DQ3 out of the I/O pins DQ0 through DQ7 (hereinafter referred to as the "x4 mode").

The selection between the modes will be discussed later. The descriptions will be first given of the operations in the x8 mode and the x4 mode. First, independently of the operations of the x8 mode and the x4 mode, four column selector lines YS of each sub block of each of the banks 0, 1, 2 and 3 are always simultaneously activated. More specifically, in a state wherein a word line has been selected by a line decoder (XDEC), four of the column selector lines YS arranged in the sub blocks 0 and 1 laterally disposed in each of the banks 0, 1, 2 and 3 are simultaneously activated. This selects a sense amplifier set associated with eight memory mats MM in the sub block 0 or 1 in each bank, and data is read from or written to a memory cell through the selected sense amplifier set.

In the x8 mode, the aforementioned activation involves the use of eight I/O pins DQ0 through DQ7, and the sub blocks 0 and 1 of each bank are simultaneously activated at the front edge of a clock, making it possible to write/read 32-bit data per bank. Therefore, each bank uses 32 sub amplifier circuits and 32 main amplifiers.

Meanwhile, in the x4 mode, four I/O pins DQ0 through DQ3 are used. In a typical conventional semiconductor memory device, the 32 sub amplifier circuits of each bank are activated, as in the case of the x8 mode, and only 16 main amplifiers of them are activated. In case where such a system is adopted, 4-bit data is transferred via the global I/O lines GIO between the 16 main amplifiers and the I/O pins DQ0 through DQ3. As a consequence, it is disadvantageous in that the x4 mode requires the same number of sub amplifier circuits as that in the x8 mode be activated, inevitably leading to large current drain.

As a solution to the above problem, the semiconductor memory device in accordance with the present invention is provided with the sub amplifier blocks at the centers of the banks 0, 1, 2 and 3. In the x4 mode, the sub amplifier circuits of the sub amplifier blocks 15 are controlled so as to activate only the sub amplifier circuits of half the sub amplifiers activated in the x8 mode. As a result, the number of the sub amplifiers activated in the x4 mode is reduced to the half of the number of the sub amplifiers activated in the x8 mode, thus permitting markedly reduced current drain to be achieved in the x4 mode. Furthermore, as shown in FIG. 1, the sub amplifier blocks 15 are all disposed at the central areas of the banks 0, 1, 2 and 3 so as to allow easy change of the number of sub amplifiers to be activated in the x8 mode and the x4 mode. Therefore, the number of main amplifiers to be operated in the x4 mode can be reduced. As a result, a power consumption can be reduced.

Figures 2A, 2B:
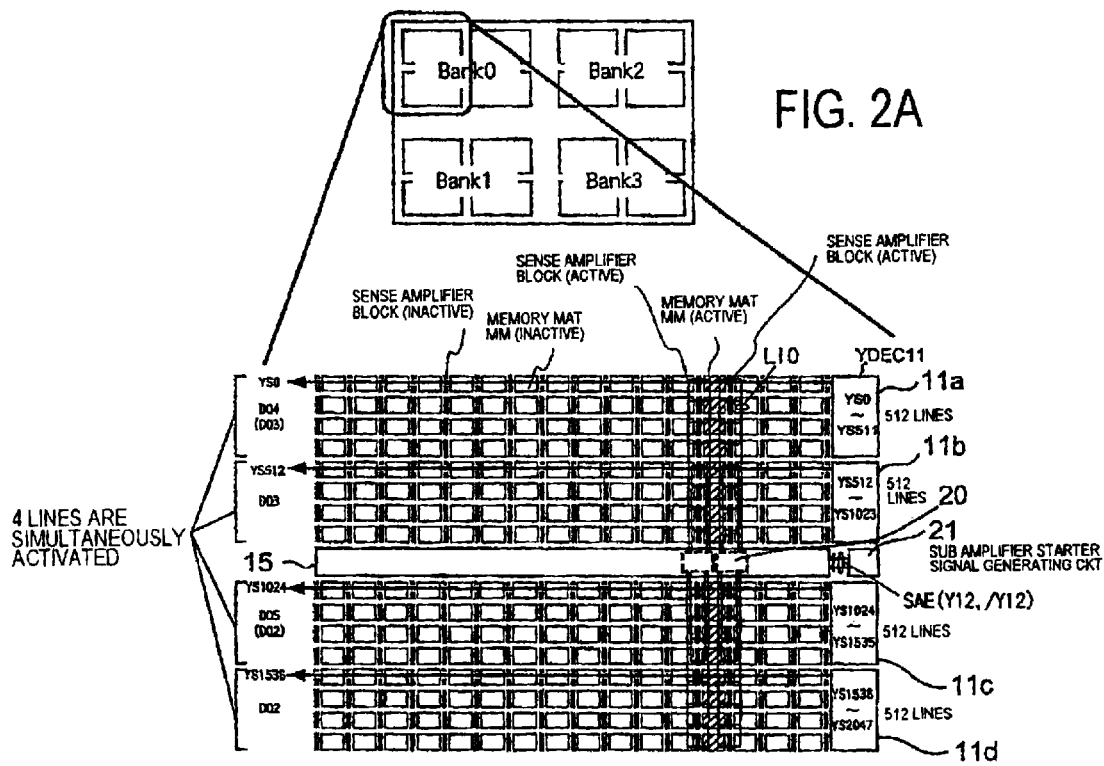
FIG. 2A and FIG. 2B are enlarged views of an essential section of the semiconductor memory device in accordance with the present invention shown in FIG. 1.
Figure 3:
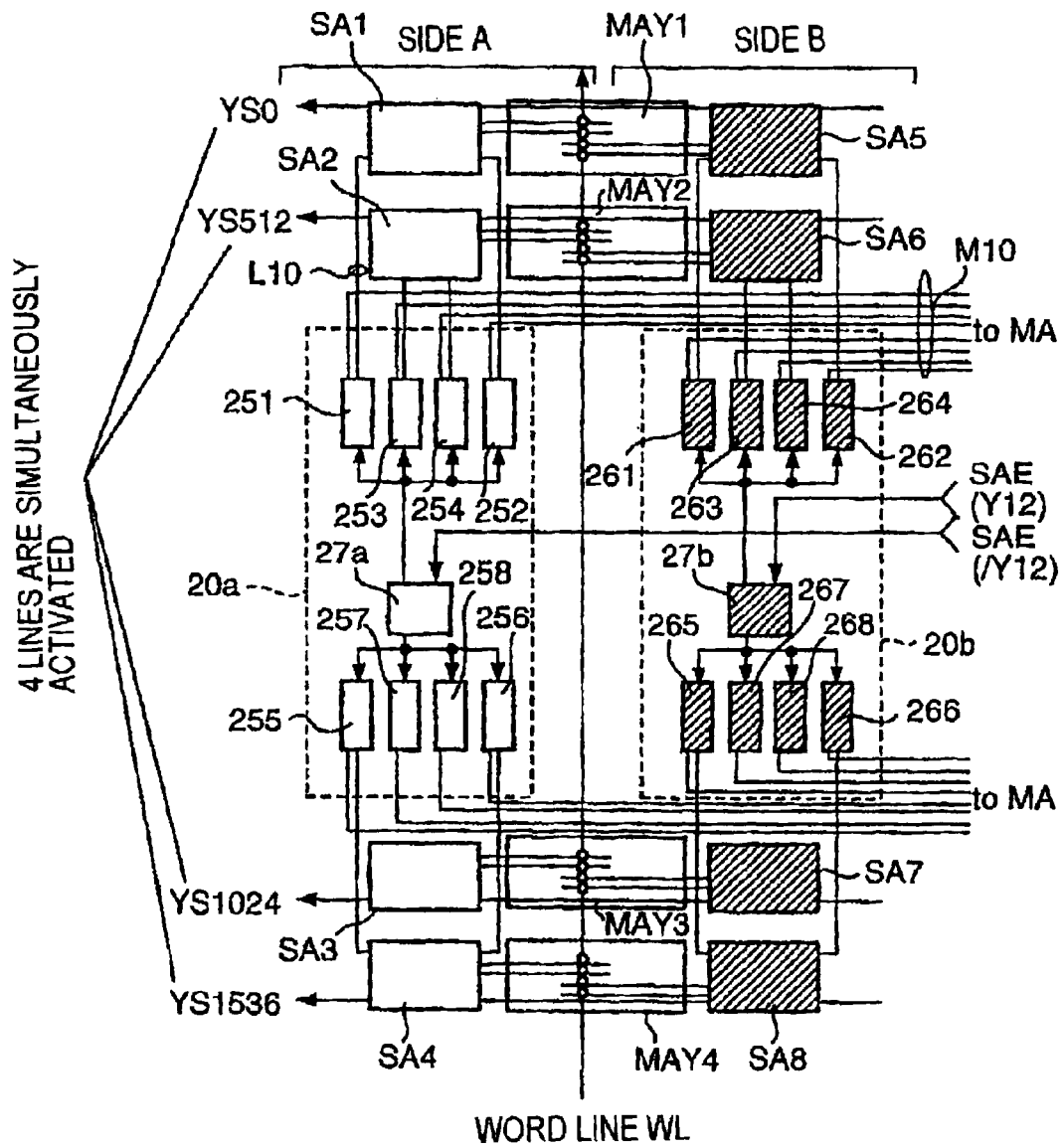
FIG. 3 is a block diagram for explaining further in detail a sub amplifier circuit unit in the semiconductor memory device shown in FIG. 2B.

Referring now to FIGS. 2A and 2B and FIG. 3, description will be made of the semiconductor memory device in accordance with the present invention more specifically by taking, for example, a part of the sub block 0 positioned at left, i.e., side A, of the bank 0 in FIG. 1. Herein, it is noted that the description will not be repeated for the configuration of the sub block 1 positioned at right, i.e., side B, of the bank 0 in FIG. 1 and the configurations of the sub blocks in the remaining banks are the same as those shown in FIGS. 2A and 2B and FIG. 3.

The detailed layout of the sub block disposed at left of the bank 0 shown in FIG. 2A is shown in FIG. 2B and FIG. 3. The sub block shown in FIG. 2B has 16×16 memory mats MM, and the memory mats MM is divided into 16×8 upper mat groups and 16×8 lower mat groups. The sub amplifier block 15 is provided between the upper mat groups and the lower mat groups. Furthermore, the sub amplifier block 15 is provided with 136 (8×17) sub amplifier circuits. The upper mat groups and the lower mat groups each have two column decoders (YDECs) 11a through 11d, each activating a single column selector line YS out of 512 column selector lines YS. The YDECs 11a through 11d will selectively activate one of the column selector lines YS's 0 through 511, 512 through 1023, 1024 through 1535, and 1536 through 2047, and each of the YDECs 11a through 11d will simultaneously select a single column selector line. As a result, four column selector lines YS's will be selected and activated. FIG. 2B illustrates a case where YS0, YS512, YS1024 and YS1536 have been simultaneously activated.

Referring to FIG. 2B, selecting the word line activates the eight memory mats of the upper mat groups and the eight memory mats of the lower mat groups, and the Y decoder (YDEC) provided in the sub block causes the four column selector lines YS (YS0, YS512, YS1024 and YS1536 in this example) to be activated. As a result, a total of 16 sub amplifiers are activated and the 16 sub amplifiers are connected to a memory array via the local I/O lines LIO. This state is shown in FIG. 3.

To explain the operations in the x8 mode and the x4 mode further in detail, the descriptions will now be given of line (X) and column (Y) addresses used for selecting a bank.

First, to select a 128M-bit bank, a 13-bit X address signal constructed of a 0th bit through 12th bit and a Y address signal are used. The Y address signal is constructed of 12 bits excluding the 10th bit (Y10) from the bits of the 0th bit (Y0) through the 12th bit (Y12). The 10th bit (Y10) of the Y address signal is used as a command signal for auto refreshing, so that it is not used for the address selection. When the Y address signal is supplied to each bank, a plurality of column selector lines YS's (Y selection lines) are simultaneously activated. In this case, the 0th bit and the first bit of the Y address signal are used for buffer switching of the output circuit, so that the Y address signal of a total of 9 bits, namely, the 2nd through the 9th bits and the 11th bit, is supplied to each bank so as to activate eight YS lines in each bank.

Moreover, according to the embodiment of the present invention, the 12th bit (Y12) of the Y address signal is used for switching between the x8 mode and the x4 mode. More specifically, the 12th bit (Y12) of the Y address signal is fixed to a high level in the x8 mode, while it is switched to Y12 (true) or /Y12 (bar) in the x4 mode.

Taking the above aspects into account, the operation of the semiconductor memory device shown in FIG. 2B will be explained with reference to FIG. 3. FIG. 3 shows an activated sub amplifier circuit 20 of the sub amplifier block 15 shown in FIG. 2B, sense amplifier sets SA1 to SA8 associated with the sub amplifier circuit 20, and the memory arrays MAYs.

FIG. 3 shows the sub amplifier block 15 positioned at the center of a bank in a concentrated fashion, memory arrays MAY1 and MAY2, each of which includes four memory mats MM disposed in the upper portion of the sub amplifier block 15, and memory arrays MAY3 and MAY4, each of which includes four memory mats MM disposed in the lower portion thereof. Furthermore, sense amplifier sets SA1 and SA5, SA2 and SA6, SA3 and SA7, and SA4 and SA8, respectively, are disposed on both sides of the memory arrays MAY 1 through 4.

Each sense amplifier set is provided with 256×4 sense amplifiers corresponding to the four memory mats MM. As in the case illustrated in FIG. 2B, it is assumed that the column selector lines YS0, YS512, YS1024 and YS1536 are activated. In this case, if the single line, column selector line YS, is selected, then the bit line pairs of the four memory mats MM in each memory array MAY are activated, causing the sense amplifier sets, e.g., SA1 and SA5, disposed on both sides of each memory array MAY to be connected to the local I/O LIO. More specifically, if the column selector line YS0 is selected, two sense amplifiers of the sense amplifier set SA1 and two sense amplifiers of SA5 are connected to the local I/O line LIO, so that data is transferred between the memory cell and the LIO through the four sense amplifiers.

Two sub amplifier circuits 20a and 20b are provided for a total of sixteen upper and lower memory mats selected by the column selector lines YS0, 512, 1024 and 1536 shown in FIG. 2B. As shown in FIG. 3, the sub amplifier circuits 20a and 20b are connected to the four sense amplifier sets SA1 through SA4 and another four sense amplifier sets SA5 through SA8, which are associated with the selected column selector line YS and are positioned on both sides of the word line WL, via the I/O line pairs LIOs. In other words, when the column selector lines YS and the word line WL are selected, the eight sense amplifier sets SA1 through SA8 provided on both sides of the memory array MAY associated with the word line WL are selected and connected to the sub amplifier circuits 20a and 20b (FIG. 3).

Referring to FIG. 2B, the sub amplifier circuits 20a and 20b of the sub amplifier block 15 are connected to a sub amplifier starter signal generating circuit 21, and controlled by a sub amplifier starter signal SAE generated by the sub amplifier starter signal generating circuit 21.

Referring also to FIG. 3, when the word line WL and YS lines are selected, the four memory arrays MAYs 1 through 4 are respectively activated, as previously described. Subsequently, the eight sense amplifier sets SA1 through SA8 disposed on both right and left sides (the left side being side A, while the right side being side B in this case) of the memory arrays MAYs are selected. As a result, the sense amplifier sets SA1 through SA4 and the sense amplifier sets SA5 through SA8 are respectively connected to the sub amplifier circuits 20a and 20b, which are different from each other. The two sense amplifier sets, SA1 and SA2 disposed at upper left (near side A) with respect to the word line WL are connected to the two sub amplifiers 251, 252 and 253, 254, respectively, of the sub amplifier circuit 20a. This indicates that the sense amplifier set SA1 is capable of inputting/outputting 2 bits at a time to/from the two sub amplifiers 251 and 252, while the sense amplifier set SA2 is capable of inputting/outputting 2 bits at a time to/from the two sub amplifiers 253 and 254 (in this case, the all sub amplifiers 251 through 254 disposed at the upper side in the figure are generically called the sub amplifiers of a first group).

Similarly, the sense amplifier set SA3 positioned at bottom left (side A) with respect to the word line WL is connected to the sub amplifiers 257 and 258 of the sub amplifier circuit 20a, while the sense amplifier set SA4 is connected to the sub amplifiers 255 and 256 of the sub amplifier circuit 20a (in this case, the sub amplifiers 255 through 258 are referred to as "the sub amplifiers of a second group").

The sub amplifiers 251 through 258 are connected to the sub amplifier control circuit 27a that operates in response to the sub amplifier starter signal SAE. In this example, the 12th bit (Y12 bar) of the Y address signal is supplied as the sub amplifier starter signal SAE to the sub amplifier control circuit 27a.

Furthermore, when the a column selector line YS and the word line WL are selected, the sense amplifier sets SA5 through SA8 positioned at right (side B) of the selected memory array MAY are activated. This causes the sense amplifier sets SA5 and SA6 to be respectively connected to the sub amplifiers 261 and 262, and 263 and 264, i.e., the sub amplifiers of the first group. Similarly, the sense amplifier sets SA7 and SA8 are respectively connected to the sub amplifiers 267 and 268, and 265 and 266, i.e., the sub amplifiers of the second group. These sub amplifiers 261 through 268 are controlled by the sub amplifier control circuit 27b that operates in response to the sub amplifier starter signal SAE (Y12 true).

Thus, each of the sub amplifier circuits 20a and 20b according to the embodiment shown in the figures is constructed of eight sub amplifiers 251 through 258 (or 261 through 268) for each array of sense amplifiers, and a single sub amplifier control circuit 27a (or 27b) for controlling the sub amplifiers. In this case, the activation of the sub amplifiers is controlled by the sub amplifier starter signal SAE, and the sub amplifier starter signal SAE is made of the Y address signal allocated in the x4 mode, that is, a column address Y12, as described above.

The operation will now be explained. Regardless of whether the mode is set to x8 or x4, four column selector lines YS are always activated at the same time. In the x8 mode, Y12 serving as the sub amplifier starter signal SAE is maintained at the high level, as previously mentioned. Therefore, the two sub amplifier control circuits 27a and 27b provided on both sides of the memory arrays MAYs 1 through 4 shown in FIG. 3 both actuate the eight sub amplifiers 251 through 258 and 261 through 268 so as to make the sub amplifiers 251 through 258 and 261 through 268 ready for transmitting or receiving data.

The x4 mode is similar to the x8 in that expected value data can be transferred between the sense amplifier sets SA1 through SA8 on both sides of activated memory mats MM and the sub amplifier circuits 20a and 20b. However, the sub amplifier control circuits 27a and 27b of the sub amplifier circuits 20a and 20b are controlled by the sub amplifier starter signal SAE. In the illustrated example, only one of the sub amplifier control circuits 27a and 27b actuates the sub amplifiers. This means that the sub amplifier control circuit 27a or 27b independently controls the sub amplifier circuit 20a or 20b on side A or side B.

More specifically, the 12th bit (Y12 bar (/Y12) and Y12 true) of the Y address signal is supplied as the sub amplifier starter signal SAE to the sub amplifier control circuits 27a and 27b. Namely, the sub amplifier control circuit 27a is OFF when /Y12 is at a low level, or ON when /Y12 is at the high level. The sub amplifier control circuit 27b is ON when Y12 is at the high level, or OFF when Y12 is at the low level. It is assumed in this example that high-level /Y12 is supplied to the sub amplifier control circuit 27a, while the low-level Y12 is supplied to the sub amplifier control circuit 27b.

In this case, the sub amplifiers 261 through 268 (hatched in FIG. 3) connected to the sub amplifier control circuit 27b on side B are inactive, and only the sub amplifier control circuit 27a on side A and the sub amplifiers 251 through 258 controlled by the sub amplifier control circuit 27a are activated. Therefore, the sub amplifiers 251 through 258 on side A are respectively connected to eight main I/O lines MIOs, and 8-bit data synchronizes with the front edge of a clock so as to be transferred to and from the main amplifiers MA connected to the main I/O lines MIOs. As a result, the buffer of the output circuit 18 shown in FIG. 1 retains 16-bit data, and the data is transferred through predetermined I/O terminal DQ.

Referring now to the operational waveforms shown in FIG. 4, the aforementioned operation will be explained in further detail. When the word line WL is switched to the high level, activating the memory cells of the 16 memory mats MM associated with the word line WL, the data of the activated memory cells is sent out onto the bit line pairs (T/B) and amplified by the sense amplifiers in the associated sense amplifier sets SA1 through SA8. In this state, when a column selector line YS is selected, data is output onto a local I/O line LIO from a selected sense amplifier sets SA1 to SA8. The data is amplified through the sub amplifiers 251 to 258 and 261 to 268, and output to the main amplifier MA.

In the x8 mode, Y12 serving as the sub amplifier starter signal SAE is set to the high level, so that the sub amplifiers 251 through 258 and 261 through 268 of both side A and side B are activated. As a result, 16-bit data is output to the main amplifiers MA via the main I/O lines MIO.

Figure 4:
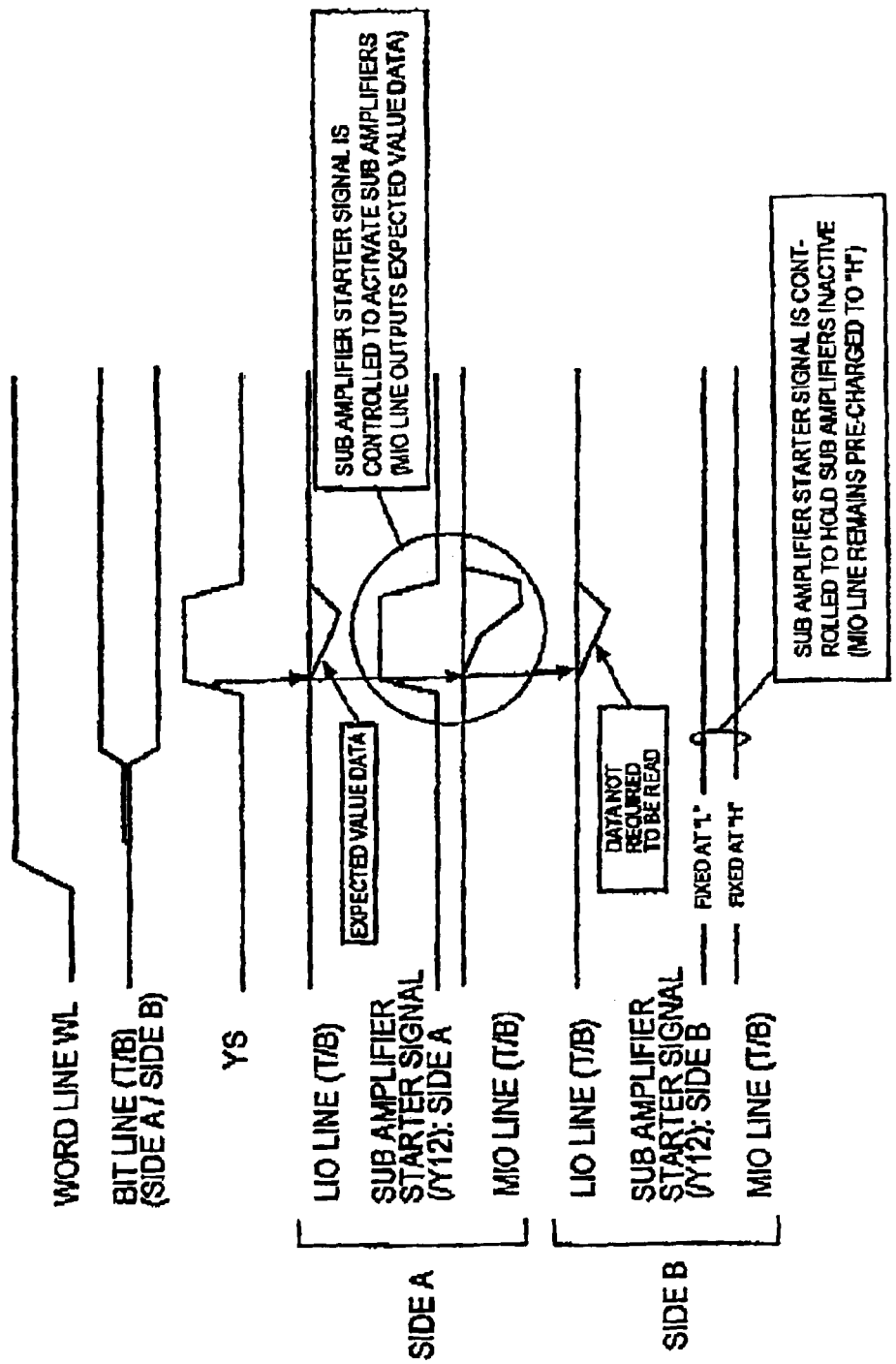
FIG. 4 is a waveform diagram for explaining the operation of the sub amplifier circuit unit shown in FIG. 3.

Meanwhile, when the sub amplifier circuit 20a on side A is selected in the x4 mode, as shown in FIG. 4, the high-level /Y12 is supplied as the sub amplifier starter signal SAE to the sub amplifier control circuit 27a in synchronization with a YS line selection signal, while the low-level Y12 is supplied as the sub amplifier starter signal SAE to the sub amplifier control circuit 27b on side B. Therefore, only the sub amplifiers 251 through 258 on side A are activated, and the sub amplifiers 261 through 268 on side B remain inactive. As a consequence, expected value data is transferred to and from only the sub amplifiers 251 through 258 on side A.

Figure 5A:
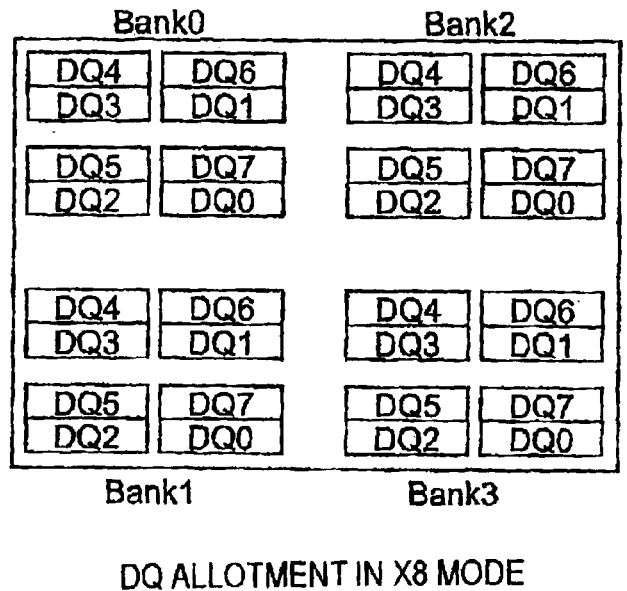
FIG. 5A and FIG. 5B illustrate the allocation of memory regions and I/O pins in a x8 mode and a x4 mode in accordance with the present invention.
Figure 5B:
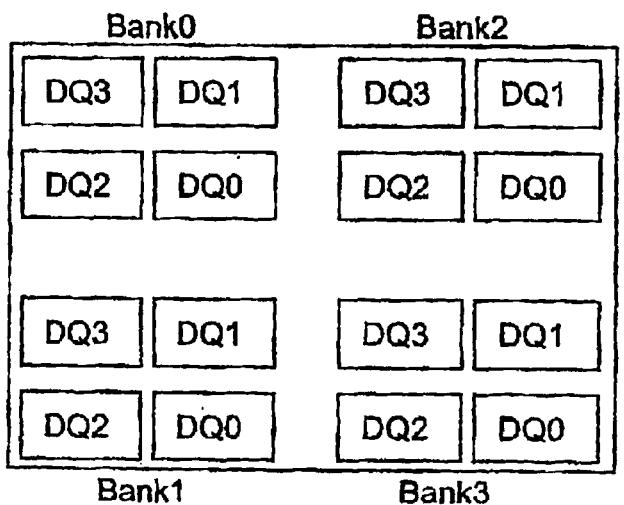

Referring to FIGS. 5A and 5B, the allocation of the memory areas in the banks 0 through 3 in relation to the I/O pins DQ0 through DQ7 will be described. FIG. 5A shows the allocation of the DQ pins in the x8 mode. Taking the bank 0 as an example, the bank is divided into four sections (top, bottom, right and left) defined by the sub amplifier block 15 and the column decoder (YDEC) 11, the memory area divided into the four sections are separated into two memory arrays. Furthermore, I/O pins DQ4, DQ3, DQ1 and DQ6 are allocated counterclockwise from top left end to the memory arrays located above the sub amplifier block 15. Similarly, I/O pins DQ5, DQ2, DQ0 and DQ7 are allocated counterclockwise to the memory arrays located below the sub amplifier block 15. This means that 4-bit data read from each memory array is output an associated I/O pin, while 4-bit data from each I/O pin is stored in an associated memory array. The same allocation of the memory arrays in relation to the I/O pins described above applies to the remaining banks 1, 2 and 3. Thus, the allocation between the memory arrays and the I/O pins is based on the one-to-one correspondence.

FIG. 5B shows the allocation of the memory arrays in relation to the I/O pins in the x4 mode. As is obvious from the figure, in the x4 mode, each of the banks 0, 1, 2 and 3 is divided into four sections defined by the sub amplifier block 15 and the YDEC 11. I/O pins DQ3, DQ2, DQ0 and DQ1 are allocated counterclockwise from top left to the memory arrays located above the sub amplifier block 15. Thus, it is understood that, in the x4 mode, DQ4 through DQ7 are not used, and in this case also, the allocation between the memory arrays and the I/O pins DQ0 through DQ3 is based on the one-to-one correspondence.

Figure 6A:
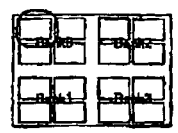

Based on the allocation of the memory areas in relation to the I/O pins shown in FIGS. 5A and 5B, more details of the allocation in the x8 mode and the x4 mode will be explained. As shown in FIG. 6A, the following description will be given by taking, as an example, the memory area of the top left portion of the bank 0, namely, the upper half of the sub block 0.

Figure 6B:
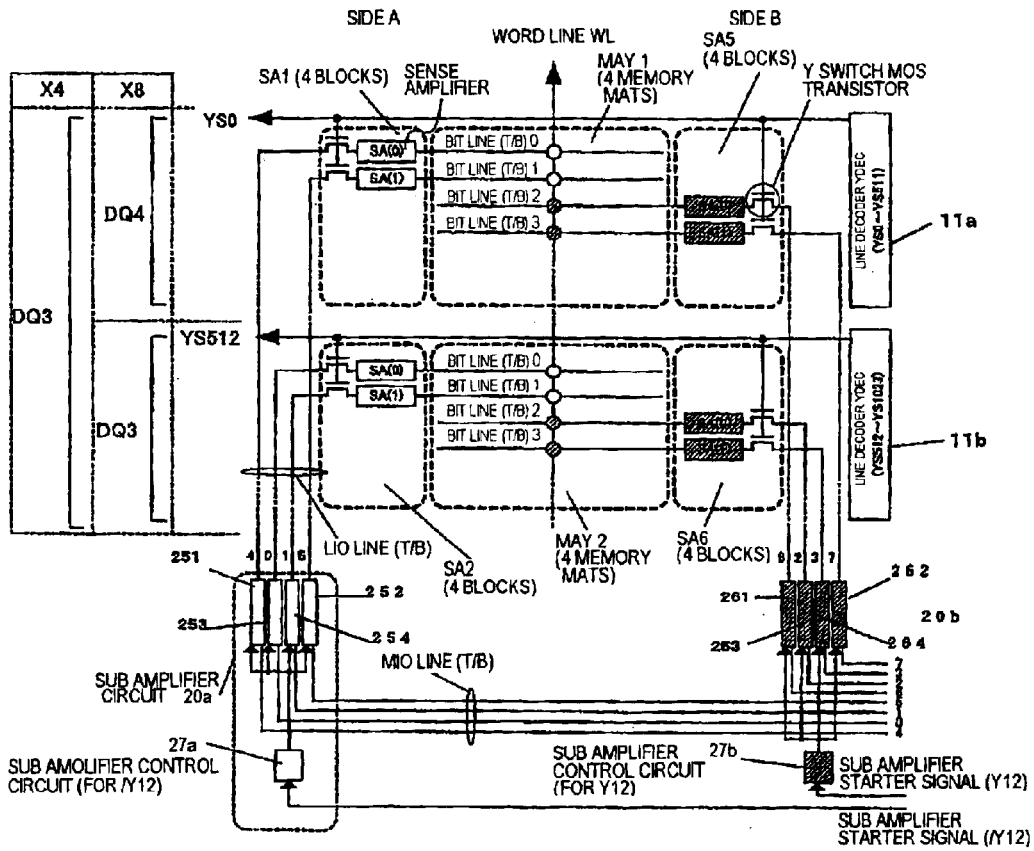

As is obvious from FIGS. 5A and 5B, in the x8 mode, the I/O pins DQ4 and DQ3 are allocated to the portion shown in FIGS. 6A and 6B, while the I/O pin DQ3 is allocated thereto in the x4 mode. In other words, data from the memory area at the top left of the bank 0 is transferred via the I/O pins DQ4 and DQ3 in the x8 mode, while the data is transferred between the memory area at the top left of the bank 0 and the I/O pin DQ3 in the x4 mode.

FIG. 6B shows memory arrays MAY1 and MAY2 located at top left of the bank 0, the sub amplifier circuits 20a and 20b, sense amplifier sets SA1, SA2, SA5 and SA6, and sub amplifier control circuits 27a and 27b.

Main I/O lines MIO0 through MIO7 shown in FIG. 6B are respectively connected to the main amplifiers MA0 through MA7, and MIO0 through MIO3 and MIO4 through MIO7 are respectively connected to one unit of DQs (DQ3 and DQ4, respectively, in this case). Furthermore, MIO0 through MIO7 are associated with local I/O lines LIO0 through LIO7 on a one-to-one correspondence basis.

More specifically, the sub amplifiers 251 through 254 on side A and the sub amplifiers 261 through 264 on side B shown in FIG. 6B are respectively connected to the eight main amplifiers MA0 through MA7 via the main I/O lines MIO0 through MIO7. The layout of the sub amplifiers 255 through 258 and 265 through 268 of the lower half shown in FIG. 6B is the same as that of the sub amplifiers of the upper half, so that the descriptions will be omitted.

In the illustrated example, the sub amplifiers 251 and 252 on side A are connected to MIO4 and MIO5, respectively, and the sub amplifiers 253 and 254 on side A are connected to MIO0 and MIO1, respectively. Similarly, the sub amplifiers 261 and 262 on side B are connected to MIO6 and MIO7, respectively, and the sub amplifiers 263 and 264 are connected to MIO2 and MIO3, respectively.

The main amplifiers MA0 through MA7 corresponding to the above MIO0 through MIO7 are switched by Y0 and Y1 of the Y address signal. In the x4 mode, /Y12 and Y12 are supplied as the sub amplifier starter signal SAE to the sub amplifier control circuits 27a and 27b shown in FIG. 6B. Therefore, it can be seen that the main amplifiers MA0 through MA7 are selected by three bits, namely, Y0, Y1 and Y12, in the x4 mode.

First, the operation in the x8 mode will be explained. In a state wherein the word line WL has been selected, a single column selector line YS0 is selected. At this time, in each of the sense amplifier sets SA1 and SA5, two sense amplifiers SA (0) and SA (1) are selected, and four bit pair lines (T/B) 0, 1, 2 and 3 of the memory array MAY1 and the local I/O lines LIO4, LIO5, LIO6 and LIO7 are connected.

At the same time when the column selector line YS0 is selected, the column selector line YS512 is also selected, so that the two sense amplifiers SA (0) and SA (1) are selected in each of the sense amplifier sets SA2 and SA6. As a result, the four bit pair lines (T/B) 0, 1, 2 and 3 of a memory array MAY2 and LIO0, LIO1, LIO2 and LIO3 are connected through the two sense amplifiers SA (0) and SA (1) in each of the sense amplifier sets SA2 and SA6.

Figure 7:
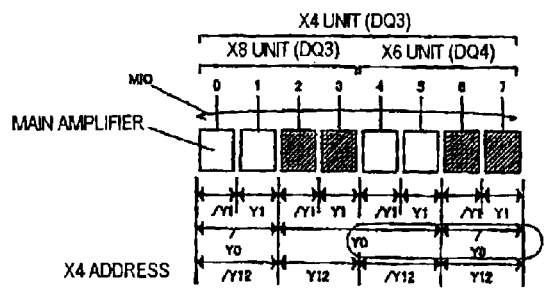
FIG. 7 illustrates the allocation of addresses in the x8 mode and x4 mode, respectively.

Adjacent bit pair lines 0 and 1 of one sense amplifier set, e.g., SA1, can be discriminated by a column address bit Y1, as shown in FIG. 7. Bit pair lines 2 and 3 of the sense amplifier set SA5, which are connected to the same memory array MAY1 as the sense amplifier set SA1 and are paired to the sense amplifier set SA1, can be discriminated by the column address bit Y0. Similarly, the bit pair lines 0, 1, 2 and 3 in the memory array MAY2 can be discriminated by Y1 and Y0.

In the x8 mode, all the eight sub amplifiers 251 through 254 and 261 through 264 of the sub amplifier circuits 20a and 20b positioned on both sides of a selected word line WL are actuated. Therefore, LIO0 through LIO7 are in connection with MIO0 through MIO7, presenting no problem.

Meanwhile, in the x4 mode, if the sub amplifier circuit 20a, for example, is selected by Y12 and Y12, LIO4, LIO5, LIO0 and LIO1 are connected to MIO4, MIO5, MIO0 and MIO1. If the sub amplifier circuit 20b is selected, LIO6, LIO7, LIO2 and LIO3 are connected to MIO6, MIO7, MIO2 and MIO3. In the x4 mode, it is necessary to store the data from the selected MIO at individual addresses in the I/O pin DQ3 equipped with a 4-bit buffer by Y1 and Y0.

However, to discriminate, for example, MIO4, MIO5 and MIO0, MIO1 by Y1 and Y0, the states of Y0 and Y1 must be changed. The same applies to discriminating MIO2, MIO3, MIO6 and MIO7 by Y0 and Y1. In other words, if Y1 and Y0 were set in the same states, then it would be impossible to store the set of MIO4, MIO5, MIO0 and MIO1 or the set of MIO4 and MIO5 and MIO2, MIO3, MIO6 and MIO7 at four separate addresses in DQ3, resulting in overlapped address allocation.

This will be explained more specifically with reference to FIG. 7 showing the main amplifiers MA0 through MA7 connected to MIO0 through MIO7, respectively. First, in the x8 mode, MIO0 through MIO3 and MIO4 through MIO7 are connected to the I/O pins DQ3 and DQ4, respectively. In the x4 mode, the set of MIO0, MIO1, MIO4 and MIO5 or the set of MIO2, MIO3, MIO6 and MIO7 is connected to DQ3.

MIO4 and MIO5, MIO0 and MIO1, MIO6 and MIO7, and MIO2 and MIO3 corresponding to the adjoining bit pair lines from the same sense amplifier set can be discriminated by /Y1 and Y1, as is obvious from the figure. Moreover, the sense amplifier sets SA1 and SA5, and SA2 and SA6 on both sides of the memory array MAY1 or MAY2 can be discriminated by /Y0 and Y0.

However, in the x4 mode, to select the set of MIO0, MIO1, MIO4 and MIO5 or the set of MIO2, MIO3, MIO6 and MIO7 by /Y12 and Y12 under the control of the sub amplifier control circuit 27a or 27b, it would be inconveniently impossible to select either one of the sets if Y0 and Y12 take the same state, as previously mentioned.

To avoid such an inconvenience, Y0 (true) is allocated to MIO4 and MIO5, and /Y0 is allocated to MIO6 and MIO7, as shown in FIG. 7. As a result, the set of MIO0, MIO1, MIO4 and MIO5 can be discriminated by the combination of /Y1 and Y1, /Y0 allocated to MIO0 and MIO1, and Y0 allocated to MIO4 and MIO5. Similarly, the set of MIO2, MIO3, MIO6 and MIO7 can be discriminated by the combination of /Y1 and Y1, Y0 allocated to MIO2 and MIO3, and /Y0 allocated to MIO6 and MIO7. Thus, in the x4 mode, four sub amplifiers of each of the sub amplifier circuits 27a and 27b shown in FIG. 6B are connected to the predetermined 4-bit terminal of DQ3.

More details will be explained in conjunction with FIG. 7. In the x4 mode, it can be understood that, if /Y12 is at the level of logic 1, then the sub amplifiers 253, 254, 251 and 252 on side A connected to MIO0, MIO1, MIO4 and MIO5 are actuated by the sub amplifier control circuit 27a. This means that the sub amplifier circuit 20a on side A shown in FIG. 6A is selected by /Y12. Similarly, in the x4 mode, if Y12 is switched to the level of logic 1, then the sub amplifier control circuit 27b connects the sub amplifiers 263, 264, 261 and 262 on side B to MIO2, MIO3, MIO6 and MIO7, respectively.

The descriptions will now be given of a case where MIO0, MIO1, MIO4 and MIO5 are connected to the sub amplifiers 251 through 254 on side A, that is, /Y12 is at the level of logic 1. If /Y0 and /Y1 are at the level of logic 1, then MIO0 is selected, or If /Y0 and /Y1 are at the level of logic 1, then MIO1 is selected. Similarly, if Y0 and /Y1 are at the level of logic 1, then MIO4 is selected, or if Y0 and Y1 are at the level of logic 1, then MIO5 is selected.

The connectional relationship between the sub amplifiers 261 through 264 on side B and MIO2, MIO3, MIO6 and MIO7 (i.e., the connectional relationship established if Y12= 1) will now be explained. If Y0 and /Y1 are at the level of logic 1, then MIO2 is selected, or if Y0 and Y1 are at the level of logic 1, then MIO3 is selected. Similarly, if /Y0 and /Y1 are at the level of logic 1, then MIO6 is selected, or if Y0 and Y1 are at the level of logic 1, then MIO7 is selected.

The semiconductor memory device shown in FIG. 6B employing the allocation of the Y addresses shown in FIG. 7 permits the use of the same layout for the memory arrays MAY1 and MAY2 and the sense amplifier sets.

As described above, however, allocating the Y0 and Y1 addresses means that the Y0 and Y1 addresses for selecting the memory mats MM in the individual memory arrays MAY1 and MAY2 are different for each memory mat. This does not give a rise to any problem in using the semiconductor memory device; however, when assessing the memory mats in the x8 mode, the scanning direction may change from one memory mat to another, requiring time for the assessment.

Figure 8A:
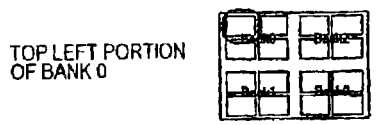
FIG. 8A shows the position of a memory region of a semiconductor memory device according to another embodiment of the present invention.
Figure 8B:
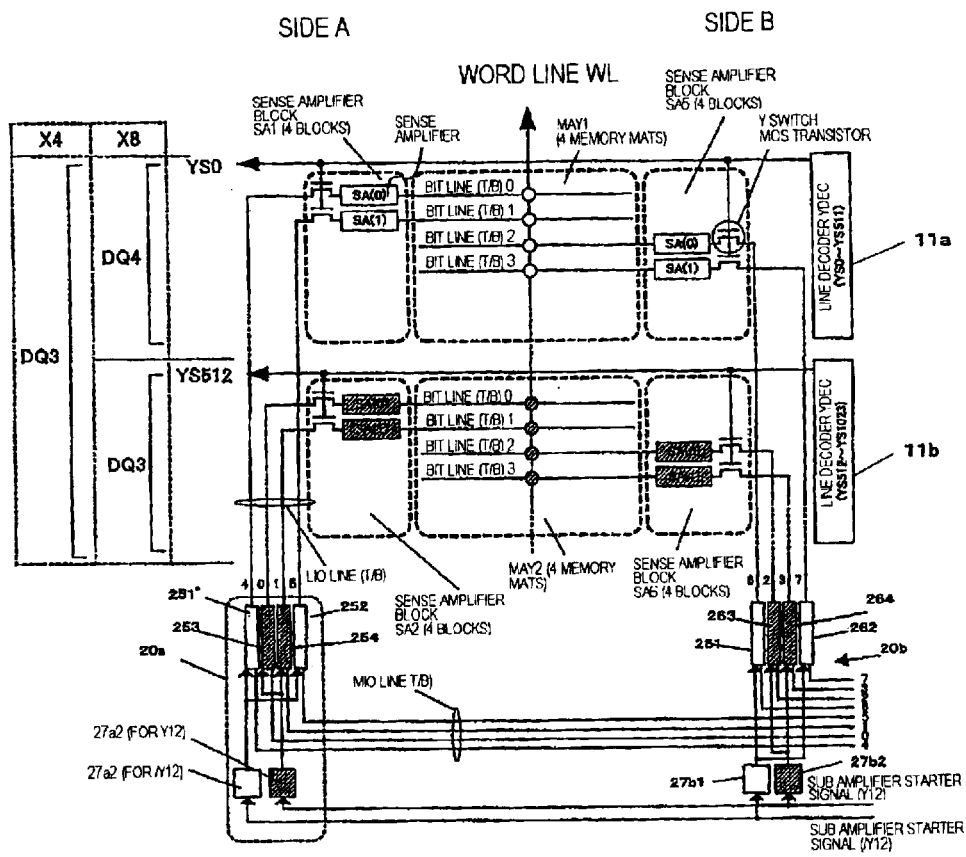
FIG. 8B is a block diagram illustrating the layout thereof.

Referring to FIGS. 8A and 8B, description will be made of a semiconductor memory device according to another embodiment of the present invention. Unlike the sub amplifier circuits 20a and 20b shown in FIG. 6B, a sub amplifier circuit 20a of this semiconductor memory device has first and second sub amplifier control circuits 27a1 and 27a2 and a sub amplifier circuit 20b thereof has first and second sub amplifier control circuits 27b1 and 27b2. FIG. 8A shows the memory area at top left of the bank 0. As in the case of FIG. 6B, the lower half sub amplifiers 255 through 258 and 265 through 268 shown in FIG. 3 have been omitted to simplify the explanation.

The hatched second sub amplifier control circuit 27a2 of the sub amplifier circuit 20a controls input/output between the sense amplifier set SA2 provided on side A of the memory array MAY2 and the sub amplifiers 253 and 254. In this example, Y12 is supplied as a sub amplifier starter signal to the second sub amplifier control circuit 27a2 to selectively connect LIO0, LIO1 and MIO0, MIO1 through the intermediary of the sub amplifiers 253 and 254.

Similarly, the first sub amplifier control circuit 27a1 of the sub amplifier circuit 20a controls input/output between the sense amplifier set SA1 provided on side A of the memory array MAY1 and the sub amplifiers 251 and 252. In this example, /Y12 is supplied as the sub amplifier starter signal to the first sub amplifier control circuit 27a1 to selectively connect LIO4, LIO5 and MIO4, MIO5 through the sub amplifiers 251 and 252 of the sub amplifier circuit 20a on side A.

Furthermore, the second sub amplifier control circuit 27b2 of the sub amplifier circuit 20b controls input/output between the sense amplifier set SA6 provided on side B of the memory array MAY2 and the sub amplifiers 263 and 264. As the sub amplifier starter signal, Y12 is supplied to the second sub amplifier control circuit 27b2 of the sub amplifier circuit 20b to selectively connect LIO2, LIO3 and MIO2, MIO3 from the sub amplifier block SA6 provided on side B of the memory array MAY2. In addition, the first sub amplifier control circuit 27b1 of the sub amplifier circuit 20b controls input/output between the sense amplifier set SA5 provided on side B of the memory array MAY1 and the sub amplifiers 261 and 262. As the sub amplifier starter signal, /Y12 is supplied to the first sub amplifier control circuit 27b1 to selectively connect LIO6, LIO7 and MIO6, MIO7 from the sub amplifier block SA5 provided on side B of the memory array MAY1.

As is obvious from the above, the first sub amplifier control circuits 27a1 and 27b1 on side A and side B, respectively, are simultaneously actuated by the sub amplifier starter signal /Y12. Similarly, the second sub amplifier control circuits 27a2 and 27b2 are also simultaneously actuated by the sub amplifier starter signal Y12. As a result, the data from the sense amplifiers of the sense amplifier sets provided on both sides of the memory array MAY1 is supplied to the sub amplifiers on both sides and output to MIOs.

In this device, the memory mats MM included in the memory arrays MAY1 and MAY2 and the sense amplifier sets SA1, SA2, SA5 and SA6 share the same configurations, and the connections between the bit pair lines and LIOs are all the same.

As is obvious from the above, according to the embodiment shown in the figures, the memory arrays MAY1 and MAY2 disposed at the upper and lower sides, respectively, in FIG. 8 are selectively switched to lead the data from the memory arrays to predetermined address locations of DQ3 in the x4 mode.

When the configuration is used, in the x4 mode, the first sub amplifier control circuits 27a1 and 27a2 provided on side A and the second sub amplifier control circuits 27b1 and 27b2 provided on side B make it possible to selectively inactivate unnecessary sub amplifiers. Thus, by providing each sub amplifier circuits with two sub amplifier control circuits, the same address allocation for the memory mats MM in the memory arrays MAYs can be used without making any changes, as shown in FIG. 6.

This will be explained more specifically, referring also to FIG. 9. First, in the x8 mode, MIO0 through MIO3 are connected to DQ3, while MIO4 through MIO7 are connected to DQ4. In the x4 mode, when Y12 at the level of logic 1 is supplied as the sub amplifier starter signal, the second sub amplifier control circuits 27a2 and 27b2 in the sub amplifier circuits 20a and 20b are actuated, thus activating the sub amplifiers 253 and 254, and 263 and 264 connected to the sense amplifier sets SA2 and SA6 of the memory array MAY2. In other words, the sub amplifier starter signal (Y12) selects the memory array MAY2. In this state, the sub amplifiers 251 and 252, and 261 and 262 connected to the memory array MAY1 are in the inactive state.

Figure 9:
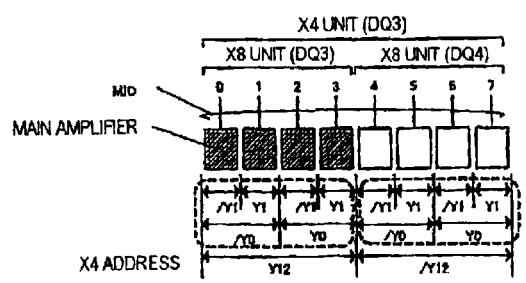
FIG. 9 is a diagram illustration the allocation of addresses in the x8 mode and the x4 mode in the layout shown in FIG. 8B.

As a result, as indicated by hatching in FIG. 9, the LIO0 through LIO3 and MIO0 through MIO3 are connected through the intermediary of the sub amplifiers 253, 254, 263 and 264, and the main amplifiers MA0 through MA3 are further connected. The data of DQ3 associated with the main amplifiers MA0 through MA3 is discriminated by the addresses /Y1, Y1, /Y0 and Y0, as shown in FIG. 9, and retained at predetermined DQ addresses.

Meanwhile, in the x4 mode, /Y12 at the level of logic 1 is supplied as the sub amplifier starter signal to the first sub amplifier control circuits 27a1 and 27b1 to actuate these control circuits. This actuates only the sub amplifiers 251, 252, 261 and 262 connected to the sense amplifier sets SA1 and SA5 on both sides of the memory array MAY1, and the remaining sub amplifiers are maintained in an inactive state. As a result, LIO4 and LIO5 are connected to MIO4 and MIO5, while LIO6 and LIO7 are connected to MIO6 and MIO7.

As shown in FIG. 9, the above state is equivalent to the state wherein the sense amplifier sets SA1 and SA5 on both sides of the memory array MAY1 have been selected by /Y12. As a result, LIO4 through LIO7 are connected to the main amplifiers MA4 through MA7, respectively, associated with DQ3 via MIO4 through MIO7. As previously mentioned, the data output via MIO4 through MIO7 can be retained at predetermined addresses of DQ3 by using /Y1, Y1, /Y0 and Y0.

Thus, this embodiment allows the set of M0, M1, M2 and M3 to be selected by Y12, and the set of M4, M5, M6 and M7 to be selected by /Y12. In other words, the memory arrays MAY1 and MAY2 are switched by Y12. Furthermore, according to the configuration of the embodiment, the allocation of the addresses of Y1 and Y0 does not have to be changed for each memory mat MM included in each sense amplifier set. This advantageously obviates the need for changing an address scanning order when assessing memory mats by scanning Y addresses in the x8 mode.

In the embodiment shown in FIG. 8B, address scanning can be accomplished without changing a Y address order for each memory array. However, the sub amplifier circuits 20a and 20b have to be provided with two sub amplifier control circuits each, namely, 27a1, 27a2, and 27b1 and 27b2, respectively, undesirably leading to a slightly increased areas.

It is possible to configure a semiconductor memory device capable of restraining an increase in the area, as compared with the example shown in FIG. 8. For example, the connection between the bit pair lines in the memory arrays and the sense amplifier sets may be changed for each adjoining memory cells thereby to select the sense amplifier sets on one side of memory mats in the x4 mode, thus allowing the same address allocation in the memory arrays to be used.

Figure 10:
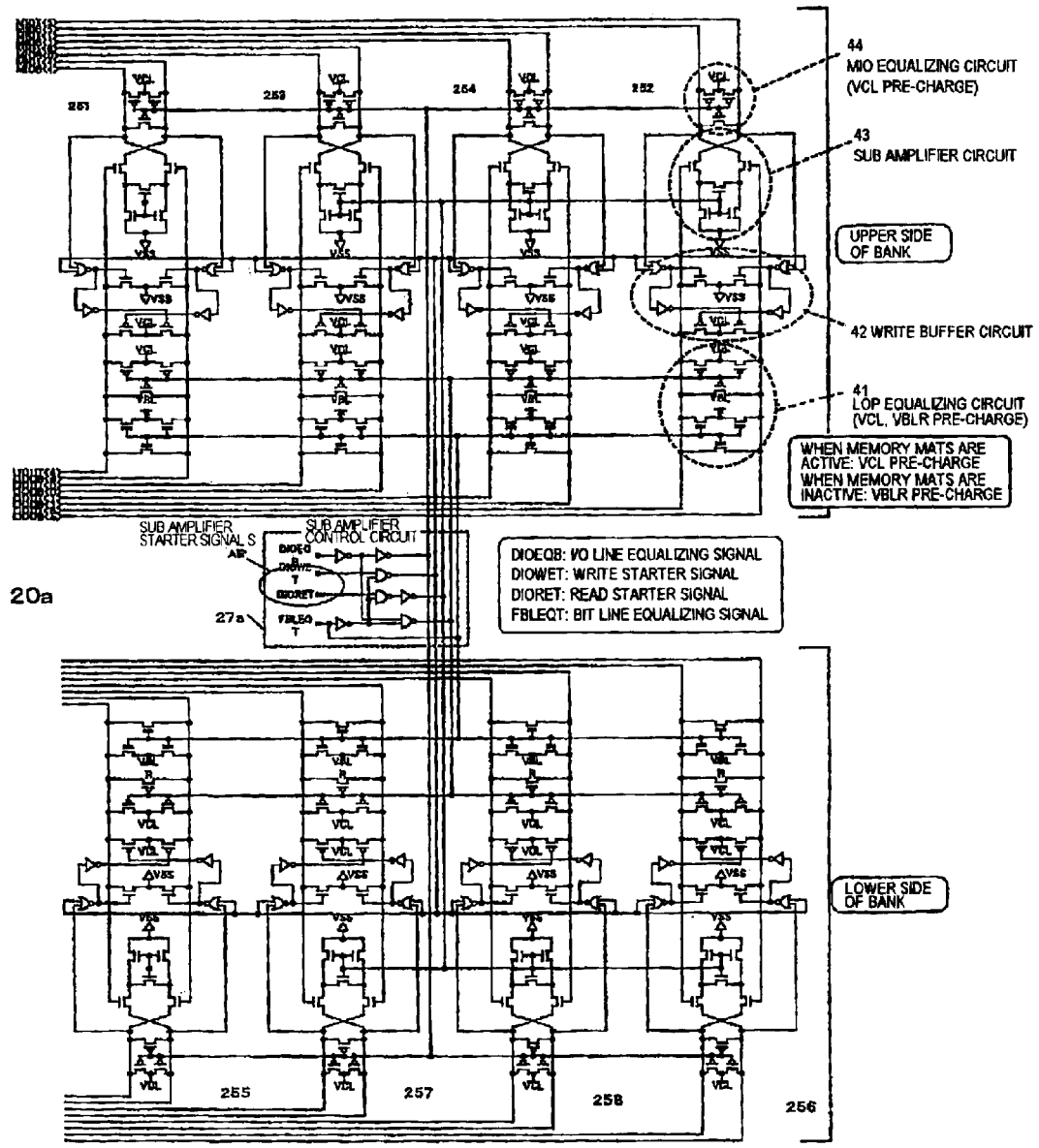
FIG. 10 is a circuit diagram showing a specific configuration of the sub amplifier circuit unit shown in FIG. 3 and FIG. 6B.
Figure 11:
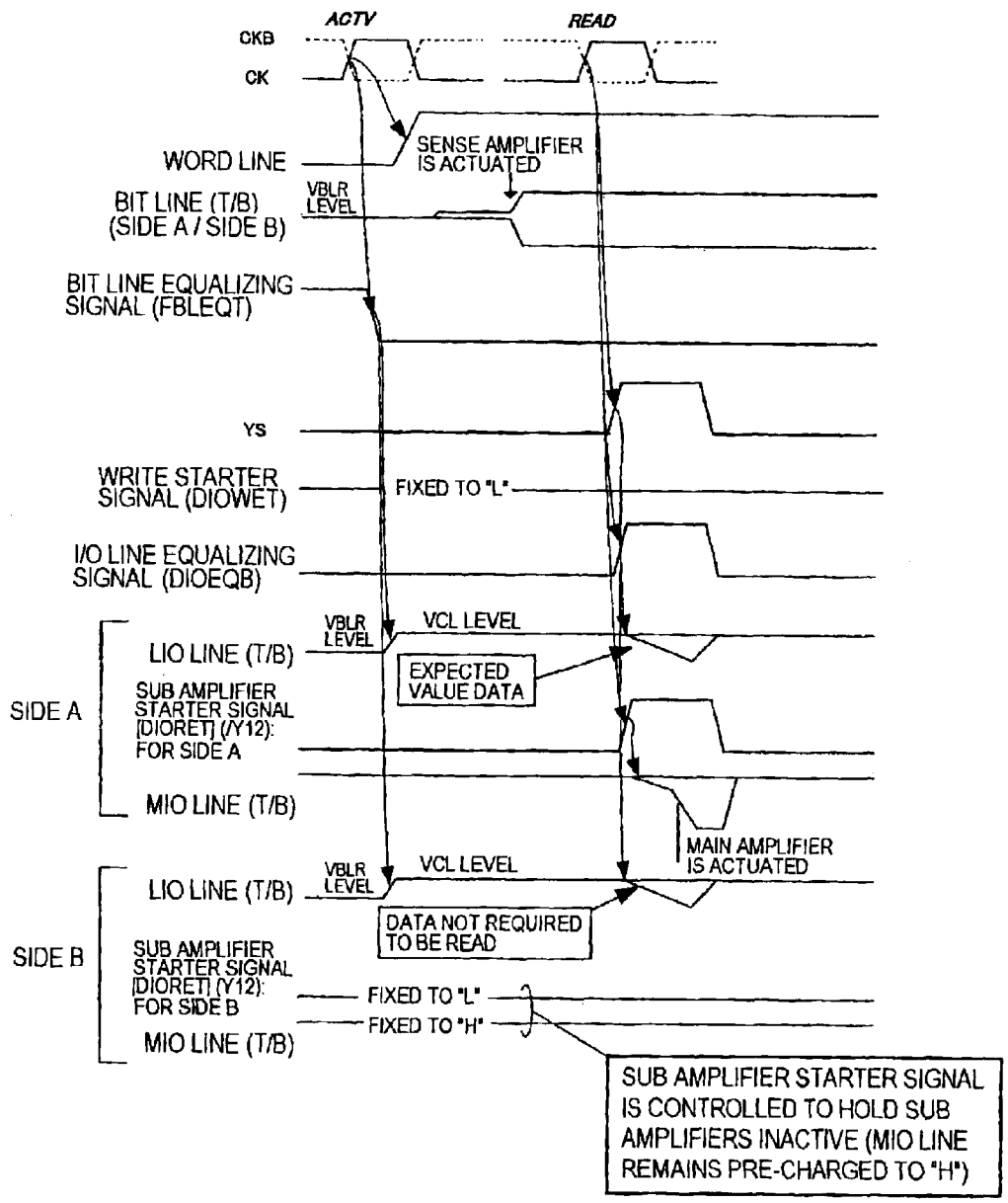
FIG. 11 is a waveform diagram for explaining the operation of the circuit shown in FIG. 10.

Referring to FIGS. 10 and 11, the specific circuit configurations of the sub amplifier circuits 20a and 20b shown in FIG. 3 and FIG. 6B will be explained. FIG. 10 focuses on the sub amplifier circuit 20a. The components corresponding to those shown in FIG. 3 and FIG. 6B will be assigned the same reference numerals. As in the case of FIG. 3, the upper and lower sub amplifiers 251 through 258 of the bank 0 will be shown, the sub amplifiers 251 though 258 being provided between the local I/O lines LIOs and the main I/O lines MIOs. The upper sub amplifiers 251 through 254 and the lower sub amplifiers 255 through 258 operate in the same manner; therefore, the following will primarily refer to only the upper sub amplifiers 251 through 254.

The sub amplifier circuit 20a shown in the figures receives a write starter signal DIOWET and a read starter signal DIORET as sub amplifier starter signals SAEs from a sub amplifier starter signal generating circuit 21. The sub amplifier circuit 20a also receives an I/O line equalizing signal DIOEQB and a bit line equalizing signal FBLEQT. Since the sub amplifiers 251 through 254 share the same circuit configurations, so that the sub amplifier 252 will be taken as the representative example. As illustrated, the sub amplifier 252 is constructed of a LIO equalizing circuit 41, a write buffer circuit 42, a sub amplifier section 43 and a MIO equalizing circuit 44, and it is connected between LIOT (5), LIOB (5) and MIOT (5), MIOB (5). In this case, the LIO equalizing circuit 41 is connected to LIOT (5) and LIOB (5), and pre-charged to a VCL potential when a memory array is active, while it is pre-charged to VBLR when a memory array is inactive. The MIO equalizing circuit 44 is connected to MIO (T) and MIO (B) to be pre-charged to VCL.

Referring to FIG. 10 and FIG. 11, the operation of the circuit shown in FIG. 10 in the x4 mode will be described. FIG. 11 illustrates the operational waveform observed when the sub amplifier circuits 20a and 20b on side A and side B, respectively, perform reading in the x4 mode. As can be seen from FIG. 11, in the sub amplifier circuit 20b on side B, DIORET supplied as the sub amplifier starter signal SAE is fixed at a low level (L). This means that Y12 serving as the signal for driving the sub amplifiers on side B is fixed at the low level, so that the MIO lines (T/B) are fixed at a high level (H).

First, as shown in FIG. 11, the LIO lines (T/B) on both side A and side B are pre-charged to the VBLR level thereby maintaining them at the equivalent level to the pre-charge level of the bit pair lines when the memory mats are inactive.

In this state, when a row address selection command ACTV is input, the bit line equalizing signal FBLEQT of an activated memory mat MM is reset. The moment the row address selection command ACTV is input, the selected word line is switched to the high level and placed in a set state. The data is read onto a bit pair line (T/B) from the memory cell connected to the selected word line. The reading of data is performed on both side A and side B.

At this time, since the bit line equalizing signal FBLEQT has been reset, the LIO line is pre-charged from the VBLR level to the VCL level and wait for a read command READ. In this state, when the read command READ is input, an expected value data is read out onto the LIO line from the bit pair line of the sense amplifier connected to a selected YS line. At the same time the YS line is set, the I/O equalizing signal DIOEQB is reset, and the sub amplifier starter signal DIORET is simultaneously set. More specifically, at the same time the YS line is set, the data of the bit pair line is read out onto the LIO line, amplified through the sub amplifier section 43, and read also onto the MIO line. Thereafter, when a certain amount of the signal has been read out onto the MIO line, a main amplifier is started to output it to a buffer of an output circuit.

Meanwhile, when the write starter signal DIOWET is supplied as a sub amplifier starter signal to the sub amplifier control circuit 27a, data is directly stored in a write buffer circuit 42 from the MIO line without passing through the sub amplifier section 43 shown in FIG. 10. This operation, however, is not directly related to the present invention, so that no further details will be described.

Thus, according to the present invention, the sub amplifier blocks are disposed in a concentrated fashion at the center of memory arrays, i.e., banks, so as to allow a plurality of sub amplifiers disposed above and below the banks to share sub amplifier control circuits. This provides an advantage of reducing a layout area required for the sub amplifier control circuits. In fact, by reducing the layout area of the sub amplifier blocks, one side of the chip has been reduced by 28.8 μm. Moreover, according to the present invention, the sub amplifiers that are not required for reading (half the sub amplifiers used in the x8 mode) can be rendered inactive in the x4 mode by a sub amplifier starter signal, making it possible to reduce current drain in the x4 mode, as compared in the x8 mode. Thus, the current drained in the x4 mode has been reduced by 13.3 mA, as compared with the x8 mode.

In addition, according to the embodiments of the present invention, each sub amplifier circuit has been provided with two sub amplifier control circuits. This makes it possible to obtain a semiconductor memory device that permits easier address scanning for assessment. Furthermore, two types of layout patterns are prepared for making connection between the memory array bit pair lines and the sub amplifier blocks, making it possible to obtain a semiconductor memory device that obviates the need for changing address allocation in each memory array without increasing the number of sub amplifier control circuits.

While this invention has thus far been disclosed in conjunction with several embodiments thereof, it will be readily possible for those skilled in the art to put this invention into practice in various other manners.

What is claimed is:

1. A semiconductor memory device having a bank which is divided into a memory array including a plurality of memory mats, comprising:
   a sense amplifier set connected to each memory array;
   a sub amplifier circuit connected to the sense amplifier set; and
   a main amplifier circuit connected to the sub amplifier circuit,
   wherein the sub amplifier circuit is disposed in a concentrated fashion in a central region wherein the bank is divided into first and second partial regions,
   the sub amplifier circuit comprises first and second groups of sub amplifiers respectively connected to a plurality of sense amplifier sets in the first and second partial regions, and a sub amplifier control circuit for controlling the first and second groups of sub amplifiers, and
   the sub amplifier control circuit is configured to commonly control the first and second groups of sub amplifiers.

2. The semiconductor memory device according to claim 1, further comprising:
   a plurality of column selector lines extending in parallel to the central region on the memory mats,
   wherein these plural column selector lines, when simultaneously activated, connect a plurality of memory arrays in the first and second partial regions with the sub amplifiers of the first and second groups through the sense amplifier sets so that the sub amplifiers of the first and second groups are commonly controlled by the sub amplifier control circuit.

3. The semiconductor memory device according to claim 2, wherein:
   the sub amplifier control circuit carries out control for selectively enabling or disabling the sub amplifiers of the first and second groups connected to the sense amplifier sets.

4. The semiconductor memory device according to claim 1, comprising:
   a starter signal generator circuit which supplies a signal at a predetermined bit position of a column selection address signal to the sense amplifier control circuit as a starter signal for starting up the sub amplifier control circuit.

5. The semiconductor memory device according to claim 2, wherein:
   when the column selector lines are simultaneously activated, two sense amplifier sets are activated in the first and second partial regions so that four sub amplifiers of the first group are connected to the activated two sense amplifier sets with respect to the first partial region,
   four sub amplifiers of the second group are connected to the two activated sense amplifier sets with respect to the second partial region, and
   the sub amplifier control circuit controls a total of eight sub amplifiers of the first and second groups to connect the sense amplifier sets in the first and second partial regions to a main amplifier through the eight sub amplifiers.

6. The semiconductor memory device according to claim 5, wherein:
   the sub amplifier control circuit discriminates between write/read of data to/from the memory mats, and
   the sub amplifier control circuit carries out control to bypass an amplifying section of each sub amplifier in a write mode while the sub amplifier control circuit carries out control to enable the amplifying section of each sub amplifier in a read mode.

7. A semiconductor memory device having a bank which is divided into memory arrays including a plurality of memory mats, comprising:

sense amplifier sets disposed on both sides of the memory arrays so as to sandwich the memory arrays;

first and second sub amplifier circuit units connected to the sense amplifier sets disposed on both sides of the memory arrays; and a main amplifier circuit unit connected to the first and second sub amplifier circuit units through main input/output lines, wherein the first and second sub amplifier circuits are disposed in a concentrated fashion in a central region wherein the bank is divided into first and second partial regions, the first and second sub amplifier circuit units comprise a plurality of sub amplifiers disposed in the plurality of sense amplifier sets disposed on both sides of the memory arrays and a sub amplifier control circuit for controlling the plurality of sub amplifiers on both sides of the memory arrays, and the sub amplifier control circuits in the first and second sub amplifier circuit units are configured to independently control a plurality of sub amplifiers in the first and second sub amplifier circuit units.

8. The semiconductor memory device according to claim 7, further comprising: a sub amplifier starter signal generating circuit for supplying sub amplifier starter signals, which are different from each other, to the sub amplifier control circuits of the first and second sub amplifier circuit units.

9. The semiconductor memory device according to claim 8, further comprising:

a plurality of column selector lines extending in parallel to the central region on the memory arrays; and a word line extending through the memory arrays in a direction in which the word line crosses the column selector lines, wherein, if the word line is selected and the plurality of column selector lines are simultaneously activated, the plurality of sense amplifier sets positioned on both sides of the memory arrays are selected and connected to the plurality of sub amplifiers provided in the first and second sub amplifier circuit units.

10. The semiconductor memory device according to claim 9, wherein:

each sub amplifier control circuit of the first and second sub amplifier circuit units carries out control to selectively enable or disable the plurality of sub amplifiers connected to the plurality of sense amplifier sets provided on both sides of the memory arrays.

11. The semiconductor memory device according to claim 9, wherein:

each sub amplifier control circuit of the first and second sub amplifier circuit units is capable of specifying a first mode for simultaneously enabling the plurality of sub amplifiers in the first and second sub amplifier circuit units positioned on both sides of the memory arrays or a second mode for selectively enabling only a plurality of sub amplifiers positioned on one side of the memory arrays.

12. The semiconductor memory device according to claim 11, further comprising:

sub amplifier starter signal generating circuits for generating sub amplifier starter signals which supply predetermined bits of mutually complementary column selection address signals as sub amplifier starter signals to the sub amplifier control circuits of the first and second sub amplifier circuit units.

13. The semiconductor memory device according to claim 12, wherein:

each of the first and second sub amplifier circuits comprises a single sub amplifier control circuit, and only the plurality of sub amplifiers of either the first or the second sub amplifier circuit unit is enabled in response to the sub amplifier starter signal in the second mode, while the plurality of sub amplifiers of both the first and second sub amplifier circuit units is enabled in the first mode in order to permit a reduction in current drain in the sub amplifiers in the second mode.

14. The semiconductor memory device according to claim 12, wherein:

each of the first and second sub amplifier circuit units comprises two sub amplifier control circuits which operate in response to mutually complementary sub amplifier starter signals, enable the plurality of sub amplifiers in the first and second sub amplifier circuit units, and disable the remaining sub amplifiers in the second mode.

15. The semiconductor memory device according to claim 11, wherein:

four column selector lines are simultaneously activated in the bank, eight sense amplifier sets positioned on both sides of four memory arrays are activated when the word line is selected, and each of the first and second sub amplifier circuit units comprises eight sub amplifiers.

16. The semiconductor memory device according to claim 15, wherein: eight sub amplifiers in either the first or the second sub amplifier circuit unit are enabled by the control of the sub amplifier control circuit in the second mode.

17. A semiconductor memory device having a bank which is divided into memory arrays including a plurality of memory mats, comprising:

sense amplifier sets disposed on both sides of memory arrays so as to sandwich the memory arrays;

first and second sub amplifier circuit units connected to the sense amplifier sets disposed on both sides of the memory arrays; and a main amplifier circuit unit connected to the first and second sub amplifier circuit units through main input/output lines, wherein the first and second sub amplifier circuit units are disposed in a concentrated fashion in a central region wherein the bank is divided into first and second partial regions, the first and second sub amplifier circuit units comprise a plurality of sub amplifiers disposed in the plurality of sense amplifier sets disposed on both sides of the memory arrays and a sub amplifier control circuit for controlling the plurality of sub amplifiers on both sides of the memory arrays, the sub amplifier control circuits in the first and second sub amplifier circuit units are configured to independently control a plurality of sub amplifiers in the first and second sub amplifier circuit units, and a wiring between the bit lines in the memory arrays and the sense amplifier sets disposed on both sides of the memory arrays is different from another wiring between the bit lines of other memory arrays and sense blocks disposed on both sides of other memory arrays.

18. A method for controlling a semiconductor memory device comprising a bank which is divided into memory arrays including a plurality of memory mats, and first and second sub amplifier circuit units connected to sense amplifier sets disposed on both sides of the memory arrays, comprising:

a mode for enabling all sub amplifiers of the first and second sub amplifier circuit units; and a mode for selectively enabling a fraction of the sub amplifiers of the first and second sub amplifier circuit units and for disabling remaining sub amplifiers, wherein the first and the second modes are selectively designated so as to permit a reduction in current drain.

* * * * *